United States Patent [19]

Nishimura et al.

[11] Patent Number: 4,882,078
[45] Date of Patent: Nov. 21, 1989

[54] PIEZOELECTRIC CERAMIC COMPOSITION FOR ACTUATORS

[75] Inventors: Tetsuhiko Nishimura, Machida; Swapan K. Basu, Tokyo; Yukio Chida; Yasuo Oguri, both of Tokyo; Shoko Inoue, Yokohama, all of Japan

[73] Assignee: Mitsubishi Kasei Corporation, Tokyo, Japan

[21] Appl. No.: 279,052

[22] Filed: Dec. 2, 1988

[30] Foreign Application Priority Data

Dec. 4, 1987 [JP] Japan ................................. 62-307271

[51] Int. Cl.$^4$ ....................... C04B 35/49; C04B 35/46
[52] U.S. Cl. ..................................... 252/629; 501/134; 501/135; 501/136
[58] Field of Search ....................... 501/134, 135, 136; 252/62.9, 62.9 PET

[56] References Cited

U.S. PATENT DOCUMENTS 4,755,493 7/1988 Takeuchi et al. ................... 501/134
4,765,919 8/1988 Tomita et al. ....................... 501/134

FOREIGN PATENT DOCUMENTS 60-098691 6/1985 Japan .
62-159480 7/1987 Japan .

Primary Examiner—William R. Dixon, Jr.
Assistant Examiner—Anthony J. Green
Attorney, Agent, or Firm—Oblon, Spivak, McClelland, Maier & Neustadt

[57] ABSTRACT

A piezoelectric ceramic composition for actuators, which consists essentially of a composite of perovskite compounds represented by the formula $$Pb_{(1-x)}La_x[z\{(Zn_\alpha Mg_{(1-\alpha)})_{\frac{1}{3}}Nb_{\frac{2}{3}}\}+(1-z)\{Zr_yTi_{(1-y)}\}]_{(1-x/4)}O_3$$

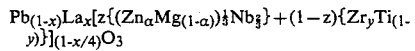

wherein $0.03 \leq x \leq 0.07$, $0.50 \leq y \leq 0.65$, $0 < z < 0.20$, and $0 < \alpha < 1$.

8 Claims, 2 Drawing Sheets

PIEZOELECTRIC CERAMIC COMPOSITION FOR ACTUATORS

The present invention relates to a piezoelectric ceramic composition for actuators.

Here, actuators are devices which utilize a reverse piezoelectric effect i.e. an effect to convert electrical energy to mechanical energy, and they are designed to perform fine displacement of micron or submicron order accurately. In recent years, research and development have been actively conducted for their applications, for example, to precise control of the sound of a buzzer or the flow rate of a pump or a valve, to auto-tracking of a VTR head, to auto-focussing, or to apparatus for precise positioning of a mechanical cutting tool in a submicron order or for fine positioning for the production of semiconductors.

Heretofore, a lead zirconate titanate ceramic composition (PZT) is known to have excellent piezoelectric properties as a piezoelectric material for actuators. Various improvements have been made depending upon the particular purposes. For example, there have been improvements in the properties of the piezoelectric material for actuators, effected by a method wherein a part of the lead zirconate titanate is substituted by a bivalent ion such as $Ba^{2+}$, $Sr^{2+}$ or $Ca^{2+}$, or by a trivalent ion such as $Bi^{3+}$ or $La^{3+}$, or by a method wherein a solid solution with a composite of perovskite compounds such as $Pb(Ni_{\frac{1}{2}}W_{\frac{1}{2}})O_3$, $Pb(Co_{\frac{1}{3}}Nb_{\frac{2}{3}})O_3$ and $Pb(Ni_{\frac{1}{3}}Nb_{\frac{2}{3}})O_3$, is prepared. Unimorph-type, bimorph-type and laminate-type are known for piezoelectric actuator elements for controlling fine displacement with a precision of micron or submicron order. They are required to have a high piezoelectric strain constant (e.g., transverse mode piezoelectric strain constant $d_{31} > 300 \times 10^{-12}$ C/N) and a high Curie temperature (Tc > 150° C.).

In general, with a material having a high piezoelectric strain constant, the Curie temperature is low. For example, with a conventional material having a high piezoelectric strain constant at a level of a transverse mode piezoelectric strain constant ($d_{31}$) exceeding $300 \times 10^{-12}$ C/N, the Curie temperature Tc tends to be as low as about 100° C., whereby the upper limit of the practical temperature of the element used to be from 50° to 60° C., and the application as a practical element has been limited. On the other hand, a material having a high Curie temperature tends to have a low piezoelectric strain constant, whereby a high voltage used to be required for the operation of such an element. Accordingly, it has been desired to develop a material having a high piezoelectric strain constant at a level of a transverse mode piezoelectric strain constant ($d_{31}$) exceeding $300 \times 10^{-12}$ C/N and a high Curie temperature (e.g. Tc > 150° C.) at the same time.

The present inventors have conducted detailed studies of the compositions to solve the above problems. As a result, it has been found that a piezoelectric ceramic composition represented by the formula

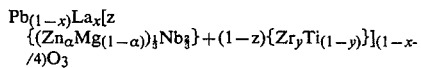

has a high electromechanical coupling factor, a high piezoelectric strain constant and a high Curie temperature. The present invention has been accomplished on the basis of this discovery.

The present invention provides a piezoelectric ceramic composition for actuators, which consists essentially of a composite of perovskite compounds represented by the formula

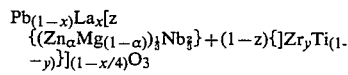

wherein $0.03 \leq x \leq 0.07$, $0.50 \leq y \leq 0.65$, $0 < z < 0.20$, and $0 < \alpha < 1$.

Now, the present invention will be described in detail with reference to the preferred embodiments.

Figure 1:
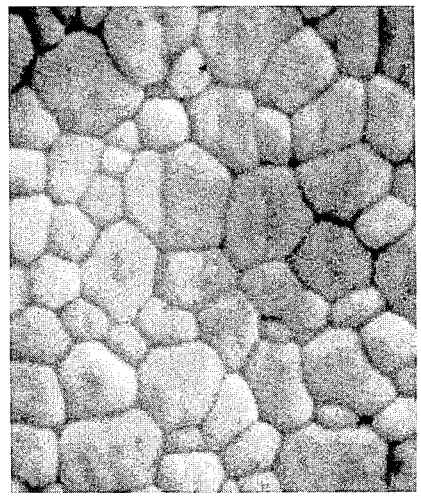
FIG. 1 is a photograph showing the structure of particles when the thermally etched surface of a piezoelectric ceramic composition for actuator according to the present invention was observed by a scanning electron microscope ($\times 5000$).

The ceramic composition of the present invention has a very high piezoelectric strain constant. The composition at the morphotropic phase boundary (MPB) of the perovskite crystals of the above formula wherein $0.045 \leq x \leq 0.07$ and $0.02 \leq z \leq 0.12$, has a transverse piezoelectric strain constant ($d_{31}$) exceeding $300 \times 10^{-12}$ C/N and a Curie temperature (Tc) of at least 150° C., whereby the above problems can be overcome, and thus it is very suitable as a material for piezoelectric actuators.

Among them, those having compositions wherein $x=0.045$, $y=0.55$, $z=0.12$ and $\alpha=0.5$; $x=0.06$, $y=0.57$, $z=0.02$ and $u=0.5$; and $x=0.06$, $y=0.58$, $z=0.02$, and $\alpha=0.5$ (Examples 5, 6 and 7) have a transverse mode piezoelectric strain constant ($d_{31}$) exceeding $300 \times 10^{-12}$ C/N and a Curie temperature of at least 200° C. and thus have a merit that they can be used within a wide range of the temperature conditions as materials for piezoelectric actuators. Further, those having compositions wherein $x=0.06$, $y=0.565$, $z=0.10$ and $u=0.3$; $x=0.06$, $y=0.57$, $z=0.10$ and $u=0.3$; and $x=0.06$, $y=0.57$, $z=0.10$ and $u=0.5$ (Examples 10, 11 and 14), have a transverse mode piezoelectric strain constant ($d_{31}$) exceeding $350 \times 10^{-12}$ C/N and a Curie temperature of higher than 150° C., and they are very excellent as materials for piezoelectric actuators.

Here, if the amount of La exceeds 0.07, Tc is likely to be less than 150° C., and $d_{31}$ will be small at a level of not more than $250 \times 10^{-12}$ C/N, such being unsuitable as a material for piezoelectric actuators. If the amount y of Zr is less than 0.50 or more than 0.65, the Zr/Ti ratio departs substantially from the morphotropic phase boundary of the perovskite crystals, whereby $d_{31}$ will be low. If the amount z of $(Zn_\alpha Mg_{(I-\alpha)})_{\frac{1}{3}}Nb_{\frac{2}{3}}$ is more than 0.20, Tc tends to be less than 150° C., and a pyrochlore phase tends to be present in the sintered product, whereby the piezoelectric strain constant will be low, such being undesirable.

An element such as a piezoelectric actuator wherein a mechanical displacement induced by an electric field is utilized, is required to have high mechanical strength. The mechanical strength of a ceramic material depends largely on the sinterability of ceramics and the size of the crystal particles. In general, the finer and the denser the crystal particles of the sintered ceramic product, the higher the mechanical strength.

The densities of the sintered products obtained by the present invention were compared with the theoretical densities calculated from the X-ray diffraction angles, whereby all of them were at least 97% of the theoretical densities.

Further, the surface of the obtained sintered product was polished to obtain a specular surface and then subjected to thermal etching treatment. Then, the fine structure was observed by means of a scanning electron microscope, whereby it was found to be composed of crystal particles having a diameter at a level of from 2 to 5 $\mu$m, and it had a highly dense, uniform and fine structure. Thus, the ceramic composition of the present invention is excellent in the sinterability, whereby it is possible to obtain a sintered product having a uniform particle size of fine particles. Also from this viewpoint, the ceramic composition of the present invention is suitable for an element such as a piezoelectric actuator wherein a mechanical displacement is utilized. In the composition of the present invention, the quantitative relation of the respective components, particularly the relation of the total amounts of Zn, Mg and Nb, and La and Zn, Mg, Nb, Zr and Ti, should preferably be as represented by the above-mentioned formula. However, so long as a composite compound obtained essentially has a perovskite structure, and the nature of the perovskite structure substantially governs the entire composition as a whole, such a composition should be regarded as included in the scope of the present invention even if the composition departs from the above formula to some extent.

The ceramic composition of the present invention may be obtained, for example, by weighing powder starting materials for a predetermined proportions, mixing the mixture in a wet system from 12 to 24 hours by e.g. a ball mill, then presintering it at a temperature of from 850° to 950° C. for 1 to 2 hours, pulverizing the presintered product again for from 12 to 24 hours in a ball mill, followed by sintering at a temperature of from 1,100° to 1,200° C. for from 1 to 16 hours. The sintered product thus obtained is electroded by firing and then subjected to polarization treatment by a usual method. In the case of the composition of the present invention, it is preferred that it is converted to a piezoelectric ceramic material by a mild polarization treatment, for example, at a temperature of from 20° to 80° C. at an electric field intensity of from 1.0 to 3.0 KV/mm for a period of from 3 to 20 minutes.

Now, the present invention will be described in further detail with reference to Examples. However, it should be understood that the present invention is by no means restricted by such specific Examples.

EXAMPLES 1 to 22 and COMPARATIVE EXAMPLES 1 to 8

PbO, TiO$_2$, ZrO$_2$, La$_2$O$_3$, MgO, ZnO and Nb$_2$O$_5$ (3N reagents, manufactured by Furuuchi Kagaku K.K.) were weighed to bring the proportions as identified in Table 1 and then mixed in a wet system for 24 hours together with ethanol in a ball mill by means of zirconium oxide (ZrO$_2$) balls. After completion of the mixing, the mixture was dried, uniaxially pressed under a molding pressure of 1 ton/cm$^2$ and then presintered at 900° C. for 2 hours. The presintered product was manually pulverized and then subjected again to pulverization by a ball mill for 24 hours to obtain a powder for sintering. The powder for sintering was preliminarily molded in a mold having a diameter of 20 mm and then finally molded by a rubber pressing method under a molding pressure of 1 ton/cm$^2$.

The molded product thus obtained was put into a high alumina crucible, then covered with a powder for a lead atmosphere and sintered at 1,200° C. for 8 hours.

FIG. 1 is a photograph of the particle structure when the surface of the sintered product obtained in Example 10 was polished to a specular surface, subjected to thermal etching treatment and then observed by a scanning electron microscope ($\times$5000). From this FIG., it is evident that the product is a ceramic sintered body having a dense structure with uniform particles size of from 2 to 5 $\mu$m. The disc shaped sintered product thus obtained was polished to have a thickness of 1 mm, and a silver paste was screen-printed to each side and fired at 600° C., to obtain a sample for measuring the Curie temperature.

The disc-shaped sintered product was polished in the same manner to a thickness of 1 mm and then punched out into a shape of 12 mm in length, 1 mm in thickness and 3 mm in width by means of a supersonic cutter. Then, a silver electrode was fired in the same manner to obtain a sample for measuring the piezoelectric strain constant (d$_{31}$). The Curie temperature was determined by measuring the dielectric constant at a measuring frequency of 100 KHz.

The piezoelectric strain constant d$_{31}$ was measured as follows. The sample for the transverse mode obtained by punching out was immersed in a silicon oil bath, the sample was polarized by applying electric field of from 1.5 to 3.0 KV/mm at 70° C., and then aged for 24 hours, and then d$_{31}$ constant was measured by means of a vector impedance analyzer at a measuring temperature of 20° C.

The results of the measurements of the piezoelectric properties and the Curie temperatures are shown in Table 1. In Table 1, $\epsilon_{33}T/\epsilon_0$ represents the dielectric constant, K$_{31}$ represents the electromechanical coupling factor, d$_{31}$ represents the transverse mode piezoelectric strain constant (unit: $\times 10^{-12}$C/N), S$_{11}^E$ represents the elastic compliance (unit: $\times 10^{-}$m$^2$/N), and Tc represents the Curie temperature.

Figure 2:
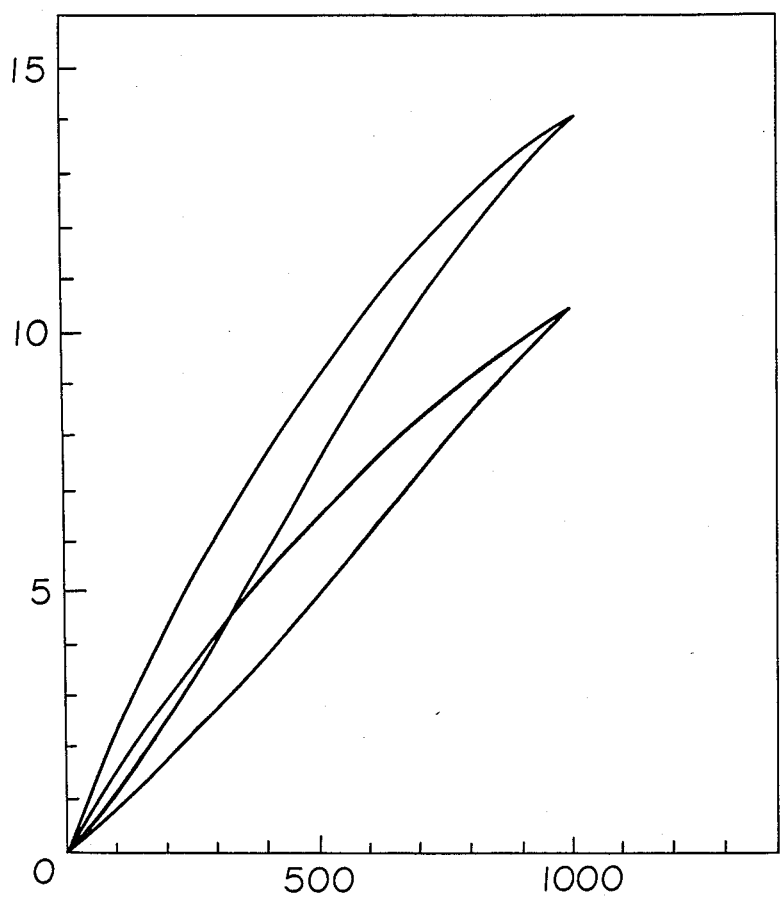
FIG. 2 is a graph showing the relation between the intensity of electric field and the strain induced in the longitudinal direction (i.e. the direction of electric field) when an electric field of 1.0 KV/mm is applied to a polarized piezoelectric ceramic composition for actuators in the same direction as the direction for polarization treatment.

FIG. 2 is a graph showing the relation between the strain add the applied electric field intensity when the strain induced in the longitudinal direction (i.e. the direction of the electric field) by an application of an electric field of 1.0 KV/mm in the same direction as the direction for polarization applied to the sample, was measured by an eddy current type high sensitivity displacement sensor (resolution: 25Å). The wave form of the applied voltage was a triangular wave form, and the sweeping was conducted at a frequency of 4/100Hz. As the sample for the measurement, the above-mentioned disc-shaped sample was subjected to polarization treatment under the same condition as mentioned above and then aged for 24 hours, and then the strain was measured.

It is known that the strain in the longitudinal direction of presently available piezoelectric actuator material is usually at a level of about 0.1% (10$\times$10$^{-4}$) under an electric field of 1.0 KV/mm. One of such examples is PLZT (6/58/42) shown as the Comparative Example. Whereas, the strain of the composition of the present invention e.g. Example 10, substantially exceeds $10\times10^{-4}$ and thus is very suitable for use as a material for piezoelectric actuators.

TABLE 1

| | mol % × 100 | | | | Sintered density | Tc | | | $S_{11}^E$ | $d_{31}$ |
|---|---|---|---|---|---|---|---|---|---|---|
| | x | y | Z | α | (g/cm²) | (°C.) | $\epsilon_{33}T/\epsilon_0$ | $K_{31}$ | (× $10^{-11}$ m²/N) | (× $10^{-11}$ C/N) |
| Example 1 | 3.5 | 50 | 16 | 0.3 | 7.81 | 237 | 3240 | 0.377 | 1.504 | 247 |
| Example 2 | 3.5 | 51 | 16 | 0.3 | 7.82 | 234 | 3332 | 0.414 | 1.516 | 276 |
| Example 3 | 3.5 | 52 | 16 | 0.3 | 7.80 | 230 | 2603 | 0.426 | 1.458 | 247 |
| Example 4 | 4.5 | 54 | 12 | 0.5 | 7.79 | 222 | 3555 | 0.398 | 1.545 | 277 |
| Example 5 | 4.5 | 55 | 12 | 0.5 | 7.82 | 217 | 3670 | 0.420 | 1.595 | 302 |
| Example 6 | 6 | 57 | 2 | 0.5 | 7.81 | 209 | 4120 | 0.422 | 1.572 | 319 |
| Example 7 | 6 | 58 | 2 | 0.5 | 7.82 | 206 | 4290 | 0.441 | 1.615 | 345 |
| Example 8 | 6 | 59 | 2 | 0.5 | 7.80 | 202 | 3790 | 0.410 | 1.493 | 290 |
| Example 9 | 6 | 56 | 10 | 0.3 | 7.82 | 179 | 5171 | 0.400 | 1.506 | 332 |
| Example 10 | 6 | 56.5 | 10 | 0.3 | 7.79 | 177 | 5436 | 0.432 | 1.588 | 377 |
| Example 11 | 6 | 57 | 10 | 0.3 | 7.78 | 175 | 5240 | 0.410 | 1.600 | 353 |
| Example 12 | 6 | 58 | 10 | 0.3 | 7.77 | 171 | 3967 | 0.423 | 1.455 | 302 |
| Example 13 | 6 | 56 | 10 | 0.5 | 7.78 | 180 | 5314 | 0.389 | 1.539 | 331 |
| Example 14 | 6 | 57 | 10 | 0.5 | 7.79 | 176 | 5272 | 0.429 | 1.553 | 365 |
| Example 15 | 7 | 58 | 6 | 0.3 | 7.79 | 157 | 5230 | 0.377 | 1.495 | 313 |
| Example 16 | 7 | 59 | 6 | 0.3 | 7.78 | 154 | 5706 | 0.387 | 1.509 | 338 |
| Example 17 | 7 | 60 | 6 | 0.3 | 7.78 | 150 | 5864 | 0.394 | 1.490 | 346 |
| Example 18 | 7 | 61 | 6 | 0.3 | 7.77 | 146 | 5688 | 0.386 | 1.501 | 335 |
| Example 19 | 7 | 58 | 6 | 0.5 | 7.80 | 160 | 5001 | 0.368 | 1.471 | 297 |
| Example 20 | 7 | 59 | 6 | 0.5 | 7.76 | 156 | 5598 | 0.385 | 1.504 | 332 |
| Example 21 | 7 | 60 | 6 | 0.5 | 7.79 | 153 | 5807 | 0.384 | 1.538 | 341 |
| Example 22 | 7 | 61 | 6 | 0.5 | 7.77 | 150 | 5762 | 0.378 | 1.498 | 330 |
| Comparative Example 1 | 7 | 60 | 0 | | 7.75 | 172 | 4305 | 0.361 | 1.497 | 273 |
| Comparative Example 2 | 6 | 58 | 0 | | 7.74 | 221 | 3620 | 0.419 | 1.511 | 291 |
| Comparative Example 3 | 5 | 57 | 0 | | 7.72 | 254 | 2320 | 0.386 | 1.495 | 214 |
| Comparative Example 4 | 4 | 56 | 0 | | 7.77 | 252 | 1669 | 0.394 | 1.444 | 182 |
| Comparative Example 5 | 7.5 | 60 | 2 | 0.5 | 7.79 | 141 | 4251 | 0.331 | 1.398 | 239 |
| Comparative Example 6 | 8 | 60 | 2 | 0.5 | 7.78 | 129 | | | Not measured Pyrochlore phase present | |
| Comparative Example 7 | 3.5 | 53 | 20 | 0.5 | 7.82 | | | | | |
| Comparative Example 8 | 3.5 | 53 | 22 | 0.5 | 7.83 | | | | | |

The piezoelectric ceramic composition obtained by the present invention has a high electromechanical coupling factor, a high piezoelectric strain constant (strain) and a high Curie temperature, and it is a ceramic composition having excellent sinterability. Therefore, it is useful for various piezoelectric materials. It has a particularly large piezoelectric strain constant, thus exhibits a large strain induced by an electric field and also has a high Curie temperature, whereby the temperature range of the use of the element is wide, and it is extremely useful as a material for piezoelectric actuators. Thus, the contribution of the present invention to the practical industrial application is very significant.

We claim:

1. A piezoelectric ceramic composition for actuators, which consists essentially of a composite of perovskite compounds represented by the formula

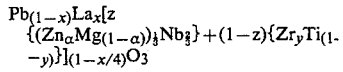

wherein $0.03 \leq x \leq 0.07$, $0.50 \leq y \leq 0.65$, $0 < z < 0.20$, and $0 < \alpha < 1$.

2. The composition according to claim 1, wherein $0.045 \leq x \leq 0.07$, and $0.02 \leq z \leq 0.12$.

3. The composition according to claim 1, wherein $x = 0.045$, $y = 0.55$, and $z = 0.12$.

4. The composition according to claim 1, wherein $x = 0.06$, $y = 0.57$, and $z = 0.02$.

5. The composition according to claim 1, wherein $x = 0.06$, $y = 0.58$, and $z = 0.02$.

6. The composition according to claim 1, wherein $x = 0.06$, $y = 0.565$, $z = 0.10$, and $u = 0.3$.

7. The composition according to claim 1, wherein $x = 0.06$, $y = 0.57$, $z = 0.10$, and $u = 0.3$.

8. The composition according to claim 1, wherein $x = 0.06$, $y = 0.57$, $z = 0.10$, and $u = 0.5$.

* * * * *

UNITED STATES PATENT AND TRADEMARK OFFICE
CERTIFICATE OF CORRECTION

PATENT NO. : 4,882,078
DATED : November 21, 1989
INVENTOR(S) : Tetsuhiko Nishimura, et. al.

It is certified that error appears in the above-indentified patent and that said Letters Patent is hereby corrected as shown below:

The units for $d_{31}$ in Table 1 in columns 5 and 6 of the patent should read "$\times 10^{-12}$ C/N" rather than "$\times 10^{-11}$ C/N".

Signed and Sealed this

Seventeenth Day of August, 1993

Attest:

BRUCE LEHMAN

*Attesting Officer*  *Commissioner of Patents and Trademarks*